(12) United States Patent
Lee

(10) Patent No.: US 7,822,561 B2
(45) Date of Patent: Oct. 26, 2010

(54) DEFECT ANALYSIS METHODS FOR SEMICONDUCTOR INTEGRATED CIRCUIT DEVICES AND DEFECT ANALYSIS SYSTEMS

(75) Inventor: Jong-hyun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 373 days.

(21) Appl. No.: 12/007,706

(22) Filed: Jan. 15, 2008

(65) Prior Publication Data
US 2008/0172190 A1  Jul. 17, 2008

(30) Foreign Application Priority Data
Jan. 15, 2007  (KR) .................. 10-2007-0004322

(51) Int. Cl.
*G01B 5/28* (2006.01)
(52) U.S. Cl. .................. 702/36; 365/200; 365/201; 702/83
(58) Field of Classification Search .............. 702/35, 702/57, 58, 81, 83, 84, 82; 365/200, 201; 714/42, 718
See application file for complete search history.

(56) References Cited
U.S. PATENT DOCUMENTS
5,844,850 A * 12/1998 Tsutsui et al. ............. 365/200
5,991,699 A * 11/1999 Kulkarni et al. ............ 702/83
2008/0080277 A1 * 4/2008 Lee ........................... 365/201

FOREIGN PATENT DOCUMENTS
| JP | 2005-142406 | 6/2005 |
|---|---|---|
| KR | 10-2002-0008108 | 1/2002 |
| KR | 1020050049604 | 5/2005 |

OTHER PUBLICATIONS

Korean Notice of Allowance (dated Jan. 29, 2008) for counterpart Korean Patent Application No. 10-2007-0004322 is provided for the purposes of certification under 37 C.F.R. §§ 1.97(e).

* cited by examiner

*Primary Examiner*—John H Le
(74) *Attorney, Agent, or Firm*—Harness, Dickey & Pierce, P.L.C.

(57) ABSTRACT

A defect analysis method includes storing, in a database, data indicative of defects and analog characteristics of corresponding defective bits in a database. A first defective area in a first wafer is found, and analog characteristics of defective bits in the first defective area are measured. The measured analog characteristics and the analog characteristics stored in the database are compared to locate a defect causing the first defective area.

20 Claims, 8 Drawing Sheets

DEFECT ANALYSIS METHODS FOR SEMICONDUCTOR INTEGRATED CIRCUIT DEVICES AND DEFECT ANALYSIS SYSTEMS

PRIORITY STATEMENT

This non-provisional patent application claims priority under 35 U.S.C. §119 to Korean Patent Application No. 10-2007-0004322 filed on Jan. 15, 2007 in the Korean Intellectual Property Office, the entire contents of which is incorporated herein by reference.

BACKGROUND

Description of the Related Art

Examples of related art defect analysis methods for static random access memories (SRAMs) include defect inspection methods, physical analysis methods, electric property measuring methods, electric tests, etc. A defect inspection method is a method in which an external appearance of a wafer is inspected during each process of manufacturing to check for defective position, size, etc. A physical analysis method is a method in which defects are found more directly by physically deprocessing the wafer after completing the manufacturing process. A related art electric test is a method in which electrical properties of cells of the SRAM are measured after completing the manufacturing process to find the position of the defective bit and a yield (e.g., a ratio of satisfactory chips to all of the chips or dies).

In related art SRAMs, a defective area may be an area in which a plurality of defective bits are formed. The defective area may be analyzed using the related art defect inspection method and/or an electric test. For example, defect data indicating the position of the defect may be obtained using the defect inspection method and defective area data indicating a position of the defective areas may be determined using an electric test. The two data may be used to estimate the defective area.

SUMMARY

Example embodiments may make finding direct causes of defective bits easier, reduce manufacturing time, cost and/or unit cost of semiconductor chips and/or mass perform defect analysis more easily. Example embodiments relate to defect analysis methods for semiconductor integrated circuit devices and defect analysis systems.

At least one example embodiment provides a defect analysis method. According to at least this example embodiment, defects and analog characteristics of defective bits having a correlation in a database may be stored, and a first defective area in a first wafer may be located. Analog characteristics of defective bits in the first defective area may be measured, and the measured analog characteristics and the analog characteristics stored in the database may be compared to determine a defect causing the first defective area.

At least one other example embodiment provides a defect analysis method. According to at least this example embodiment, a first defective area in a first wafer formed by a plurality of defective SRAM cells may be located by performing an electric test on the first wafer. Defects in the first wafer may be found by performing a physical analysis on the first defective area. Analog characteristics of defective SRAM cells of which positions match with the defect position in the first defective area may be measured, and whether there is a correlation between the defect in the first defective area and the analog characteristic of the defective SRAM cell in the first defective area may be verified. The defect and the analog characteristic defined to have a correlation in a database may be stored. A second defective area in a second wafer formed by defective SRAM cells may be located by performing an electric test on the second wafer, and analog characteristics of the defective SRAM cells in the second defective area may be measured. A defect causing the second defective area may be determined by comparing the measured analog characteristics of the SRAM cells in the second defective area and the analog characteristics stored in the database.

At least one other example embodiment provides a defect analysis system. According to at least this example embodiment, the defect analysis system may include a database configured to store defects and analog characteristics having a correlation. An electric tester may be configured to locate a first defective area in a first wafer. An analog characteristic tester may be configured to measure analog characteristics of defective bits in the first defective area, and an analyzer may be configured to analyze a defect causing the defect by comparing the measured analog characteristics and the analog characteristics stored in the database.

At least one other example embodiment provides a defect analysis method. According to at least this example embodiment, at least one first defect and at least one associated analog characteristic may be stored in a database, and a first defective area in a first wafer may be located. At least one analog characteristic of at least one first defective bit within the first defective area may be measured, and the at least one measured analog characteristic may be compared with the at least one stored analog characteristic to determine whether the at least one first defect is a cause of the at least one first defective area.

According to at least some example embodiments, a second defective area in a second wafer may be located and at least one second defective bit within the second defective area may be identified. At least one analog characteristic of the at least one second defective bit may be measured and the at least one second defective bit and the at least one measured analog characteristic may be associated with the at least one first defect. The at least one first defect and the associated at least one measured analog characteristic may be stored in the database.

According to at least some example embodiments, a circuit indicative of the at least one first defect may be modeled and the at least one first defect may be associated with the at least one second defective bit based on a comparison of an analog characteristic obtained by simulating the modeled circuit and the at least one measured analog characteristic for the at least one second defective bit.

According to at least some example embodiments, an electric test may be performed on the second wafer to determine a position of the at least one second defective bit. The electric test may be performed after manufacturing the second wafer. A physical analysis may be performed after manufacturing the second wafer to determine a position of the at least one first defect. The at least one first defect may be associated with the at least one second defective bit based on the position of the at least one first defect and the position of the at least one second defective bit. The analog characteristics of the at least one second defective bit having a position matching a position of the at least one first defect may be measured. A defect inspection may be performed on the second wafer during the manufacturing process of the second wafer to determine a position of at least one first defect formed on the second wafer. The at least one first defect may be associated with the at least one second defective bit based on the position of the at least one second first and the position of the at least one second defective bit.

An electric test may be performed after manufacturing the first wafer to determine a position of at least one first defective bit. The at least one first defective bit may be a static random access memory cell. The at least one analog characteristic may be measured by measuring current flowing through at least one transistor included in the static random access memory cell. For example, a first voltage may be applied to a first bit line, a second bit line and a word line, and a current flowing into the at least one transistor may be measured.

According to at least some example embodiments, the at least one first defective bit may be selected from a plurality of first defective bits in the first defective area, and at least one analog characteristic for the selected at least one first defective bit may be measured.

A cause of the first defective area may be identified based on a size of the at least one first defect and a first ratio. The first defect may be identified as a cause of the first defective area if the size of the first defect is larger than a first ratio.

According to at least some example embodiments, an electric test may be performed on the second wafer to locate a second defective area in a second wafer. The second defective area may be formed by a plurality of defective static random access memory cells. A physical analysis may be performed on the second defective area to identify a plurality of second defects in the second wafer, and analog characteristics of defective static random access memory cells having associated positions matching positions of second defects in the second defective area may be measured. Whether there is a correlation between each second defect and each defective static random access memory cell may be determined, and each correlated second defect and associated analog characteristic may be stored in the database. The first defective area may be formed by defective static random access memory cells and located by performing an electric test on the first wafer.

According to at least some example embodiments, at least one defective static random access memory cell may be selected from among a plurality of defective static random access memory cells, and analog characteristics associated with the at least one selected defective static random access memory cell may be measured.

At least one other example embodiment provides a defect analysis system. According to at least this example embodiment, the defect analysis system may include a database, an electric tester, an analog characteristic tester and an analyzer. The database may be configured to store at least one first defect and at least one associated analog characteristic. The electric tester may be configured to locate a first defective area in a first wafer. The analog characteristic tester may be configured to measure at least one analog characteristic of at least one first defective bit within the first defective area. The analyzer may be configured to analyze a defect by comparing the at least one measured analog characteristic with the at least one stored analog characteristic to determine whether the at least one first defect is a cause of the at least one first defective area.

According to at least some example embodiments, the defect analysis system may further include a defect inspector. The defect inspector may be configured to locate at least one second defect in a second wafer by performing defect inspection on a second wafer. The electric tester may be further configured to locate a second defective area in the second wafer. The analog characteristic tester may be further configured to measure at least one analog characteristic of at least one second defective bit in the second defective area. The analyzer may be further configured to determine whether the at least one second defect and the at least one analog characteristic are correlated, and store the at least one second defect and correlated at least one analog characteristic in the database if the at least one second defect and at least one analog characteristic are determined to be correlated.

According to at least some example embodiments, the analyzer may be further configured to locate a first defect associated with each of the plurality of the first defective bits by comparing the at least one measured analog characteristic and the at least one analog characteristic stored in the database, and determine a cause of the first defective area based on a size of the located first defect and a first ratio. The analyzer may determine that the first defect is a cause of the first defective area if the size of the located first defect is larger than the first ratio.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
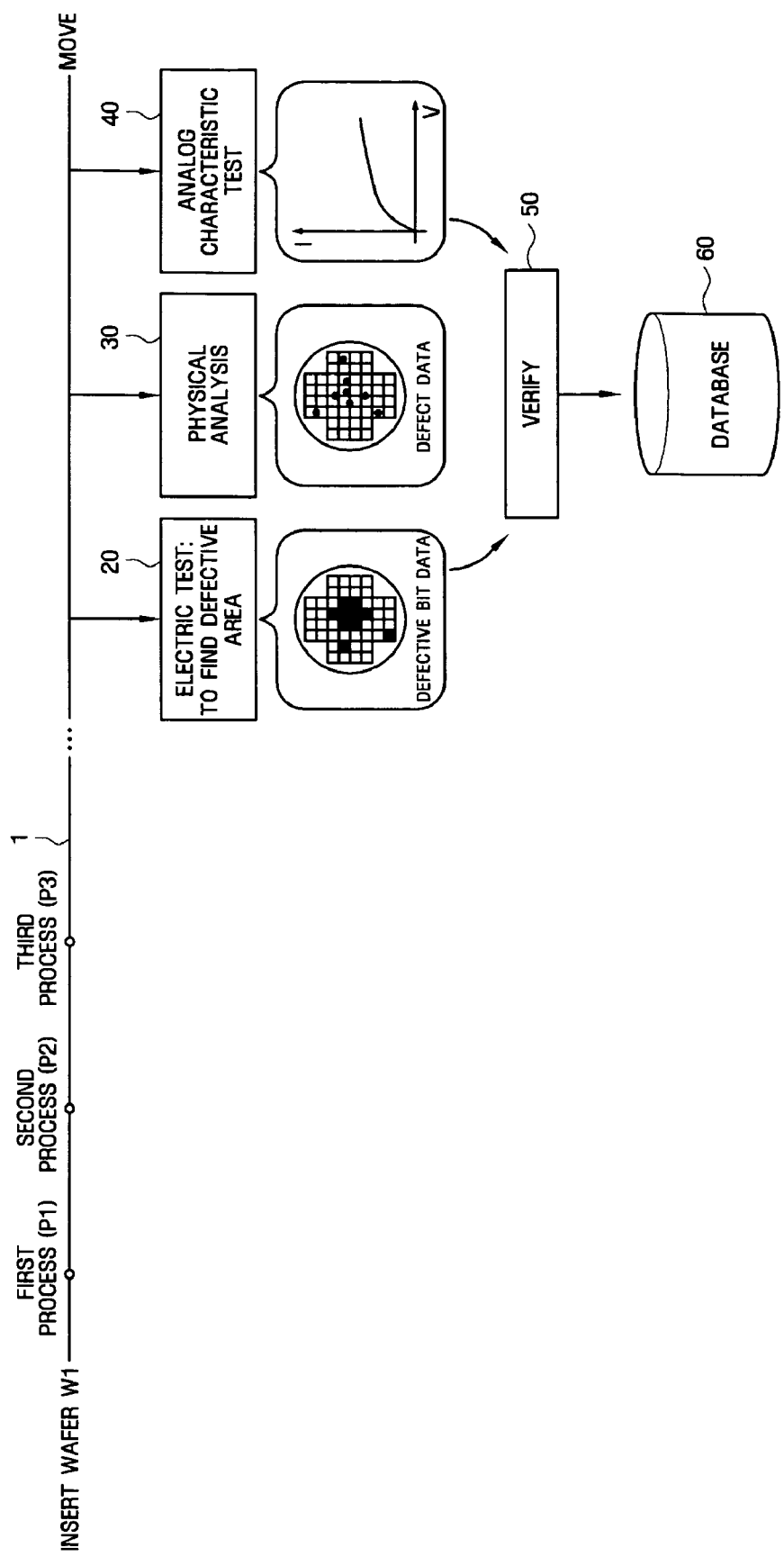
FIGS. 1 and 2 illustrate methods for creating databases according to example embodiments.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Even though the terminologies "first, second, etc." are used to describe various component, elements and/or sections, these components, elements and/or sections are not limited to these terminologies. These terminologies are used only to distinguish a single component, element, or section from other components, elements or sections. Accordingly, the first component, the first element, or the first section may also be referred to as the second component, the second element, or the second section within this technical scope of this invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

If there is any other definition, the terminology (including technical and scientific terminologies) used herein may be commonly understood by a person having a skill in the art to which this invention pertains. Further, terminologies that are defined in the dictionary are not excessively interpreted as long as it is not obviously specifically defined.

Figure 2:
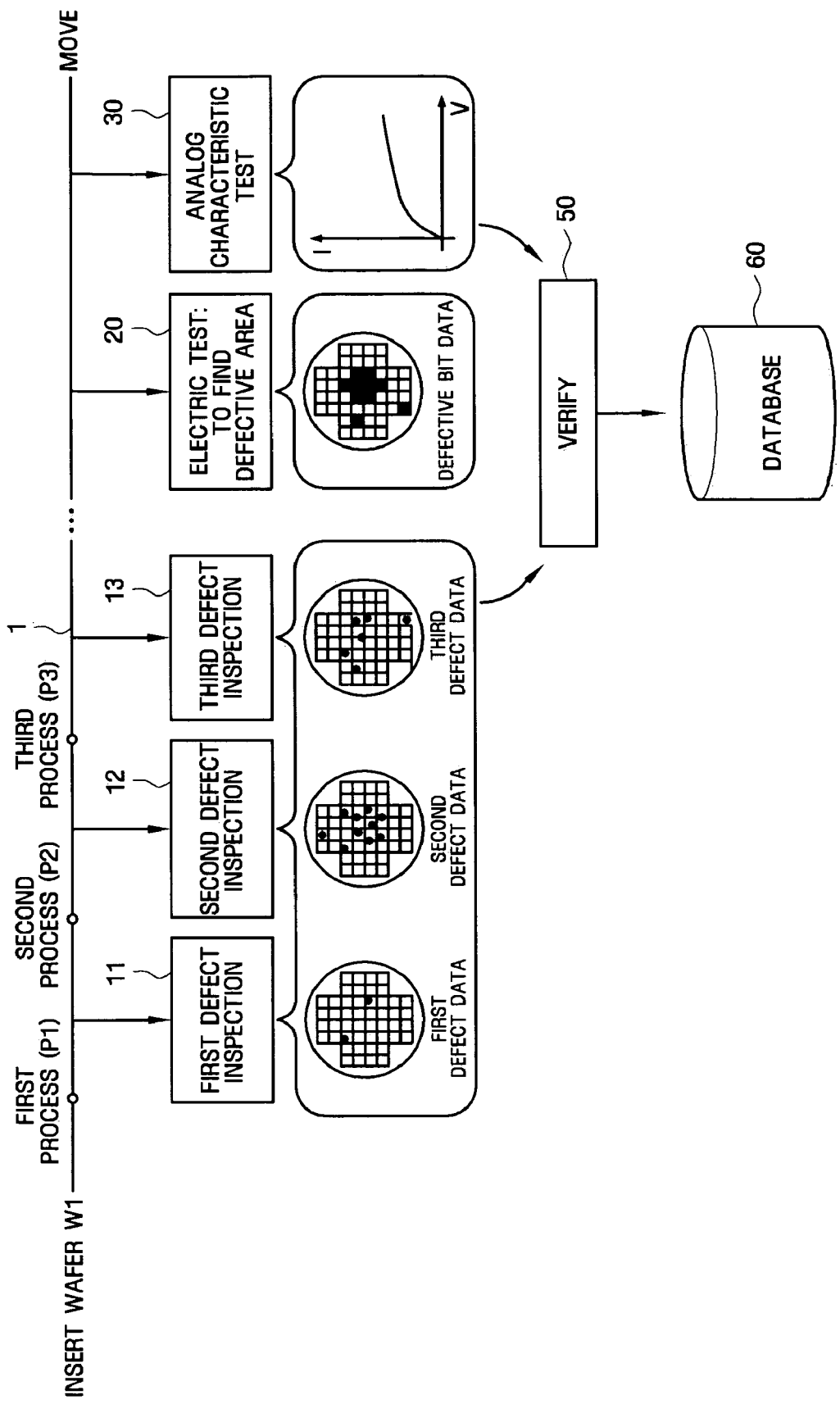
Figure 3:
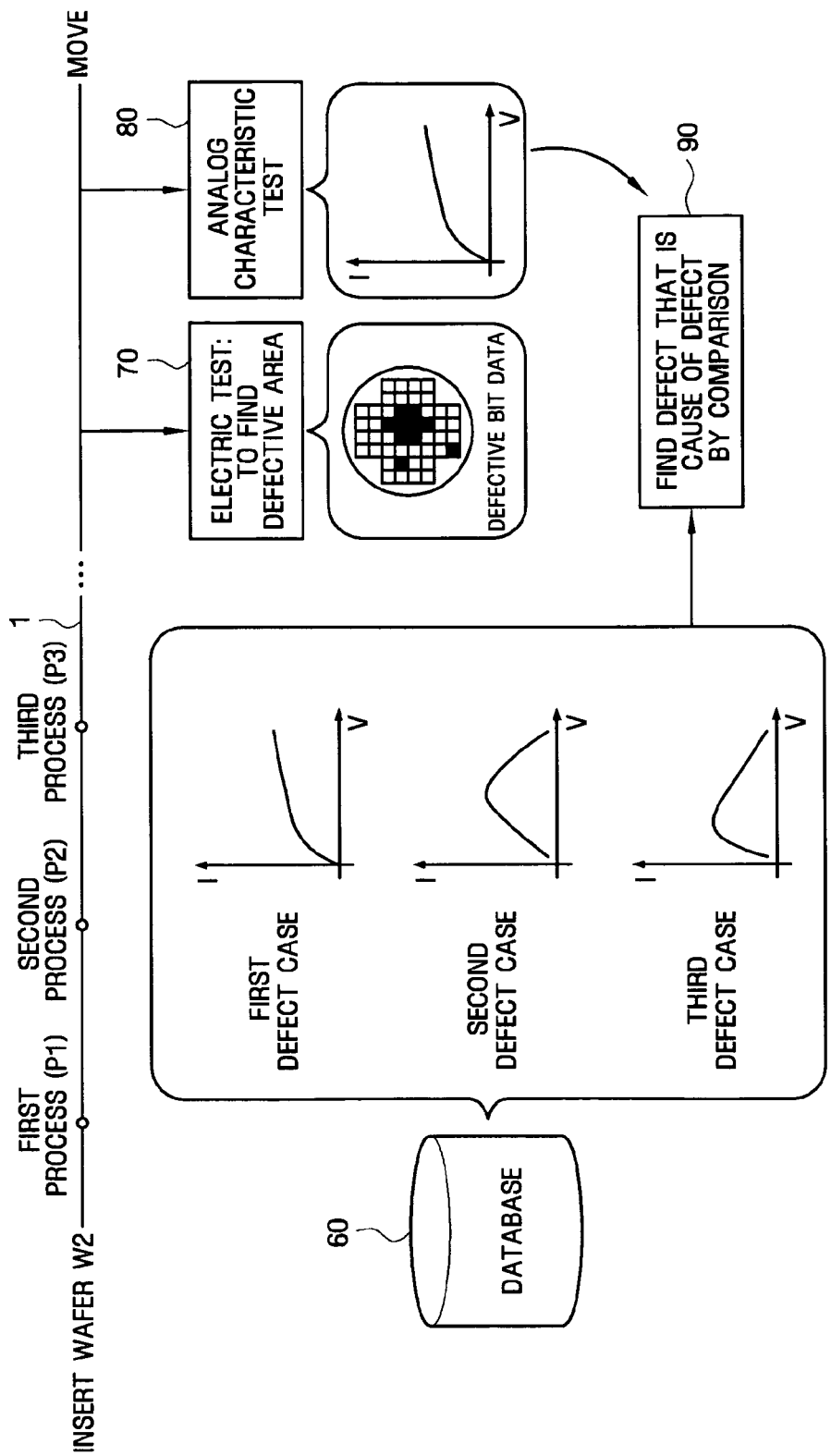
FIG. 3 illustrates a defect analysis method for semiconductor integrated circuit devices according to an example embodiment.

FIGS. 1 and 2 illustrate methods for creating databases according to example embodiments. FIG. 3 illustrates a defect analysis method for semiconductor integrated circuit devices according to an example embodiment.

Referring to FIG. 1, a manufacturing line 1 may include a plurality of manufacturing processes. The plurality of manufacturing processes may include a first process P1, a second process P2 and a third process P3. Although only three manufacturing processes are shown in FIG. 1, example embodiments may include any number of manufacturing processes. Manufacturing equipment corresponding to processes P1, P2 and P3, respectively, may be provided on the manufacturing line 1.

When a wafer W1 is inserted in the manufacturing line 1, the first through third processes P1 to P3 may be performed (e.g., sequentially). During the processes P1 to P3, a plurality of chips for a semiconductor integrated circuit device may be formed (e.g., simultaneously) on the wafer W1. In at least this example embodiment, the semiconductor integrated circuit device may include a memory area having a plurality of memory cells arranged, for example, two dimensionally. The memory cells may be SRAM cells, but are not limited thereto.

After completing the manufacturing process of the wafer W1, an electric test 20 may be performed on the wafer W1 to locate a defective area on the wafer W1. In this example, the defective area refers to an area formed by one or more (e.g., a plurality of) defective bits.

For example, the electric test 20 may measure electrical characteristics of the memory cells in the manufactured chip to locate or find defective bits. In one example embodiment, the electric test 20 may write data to and read (e.g., the same) data from the memory cells. If the read data does not match the written data, the memory cell may be defective.

Still referring to FIG. 1, the defective bit data generated during the electric test 20 may include a position of a defective bit (e.g., an x, y address), a defect type or mode (e.g., one bit defect, two bit defects, a block defect), yield, etc. In at least this example, the yield refers to a ratio of good chips with respect to the total chips, the good chips referring to chips without defective bits, and a bad chip referring to a chip including a defective bit. In the defective bit data shown in FIG. 1, the large circle refers to a wafer, the black square in the wafer indicates a bad chip, and the white square indicates a good chip.

The operator may observe defective bit data obtained as described above, and if the defective bits form an area having a specific or particular shape, the area may be defined as a defective area.

Figure 4:
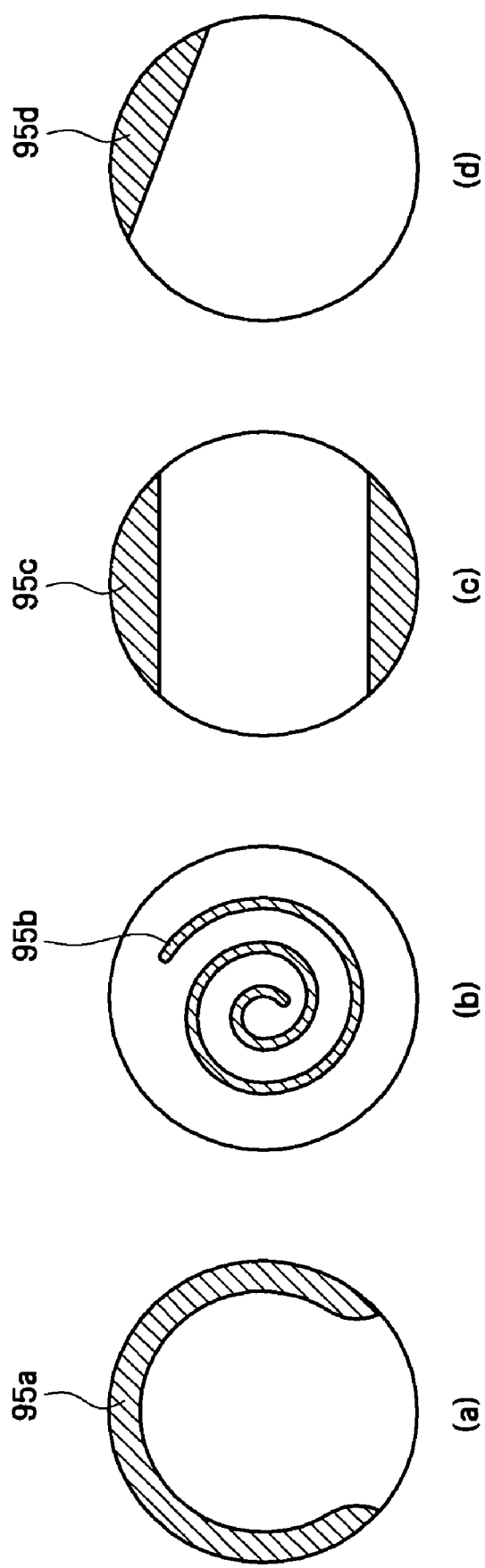
FIG. 4 illustrate example defective areas.

FIG. 4 illustrates example defective areas. In FIGS. 4A-4D, the large circle refers to a wafer, and the shaded portion refers to defective areas 95a, 95b, 95c and 95d. As shown in FIG. 4A, the defective area 95a may be formed (e.g., continuously) along a part of an outer portion of the wafer, for example, on the upper, right and left sides of the wafer in a toilet bowl-like shape. As shown in FIG. 4B, the defective area 95b may be spirally formed from the center to the outside. As shown in FIG. 4C, the defective area 95c may be formed in two pieces on opposite sides of the wafer (e.g., on an upper side and a lower side). As shown in FIG. 4D, the defective area 95d may be formed (e.g., continuously) on the upper side and the right side (or the left side) of the wafer like a cap. The name of the defective area may be changed depending on the operator. In the defective bit data shown in FIG. 1, a defective area in which the defective bits are concentrated on the center of the wafer (referred to as a center-concentrated defective area) is illustrated.

Returning to FIG. 1, physical analysis 30 may be performed on the wafer W1 to locate or find a defect in the defective area. The physical analysis 30 may include physically deprocessing the wafer or chips, and photographing the surface of the deprocessed wafer or chips using a scanning electron microscope (SEM), a transmission electron microscopy (TEM) or the like to determine (e.g., directly determine) whether a defect exists. Using the physical analysis 30, defects may be found more precisely than inspecting whether a defect is formed on a wafer W1 when a layer is formed on the wafer W1 during the manufacturing process. For example, a void formed in a contact may be found using the physical analysis 30, but not defect inspection.

The photograph data obtained during physical analysis 30 may be referred to as defect data, and is illustrated in FIG. 1. The large circle indicates a wafer, the square in the wafer indicates a chip (or a die) and the black mark indicates a located defect. In the defect data illustrated in FIG. 1, the position of the defect is represented in the wafer for the convenience of understanding, and it may be different from the defect data obtained by a actual physical analysis 30.

Still referring to FIG. 1, an analog characteristic test 40 may be performed to measure the analog characteristic of the defective bit or bits in the defective area. According to at least this example embodiment, during the analog characteristic test 40 analog characteristics of defective bits in which the position obtained during the electric test 20 matches the position obtained during the physical analysis 30 may be generated. For example, if the address of the defect and the address of the defective bit are relatively close, equal or substantially equal to one another, the position of the defective bit may match the position of the defect.

Figure 5:
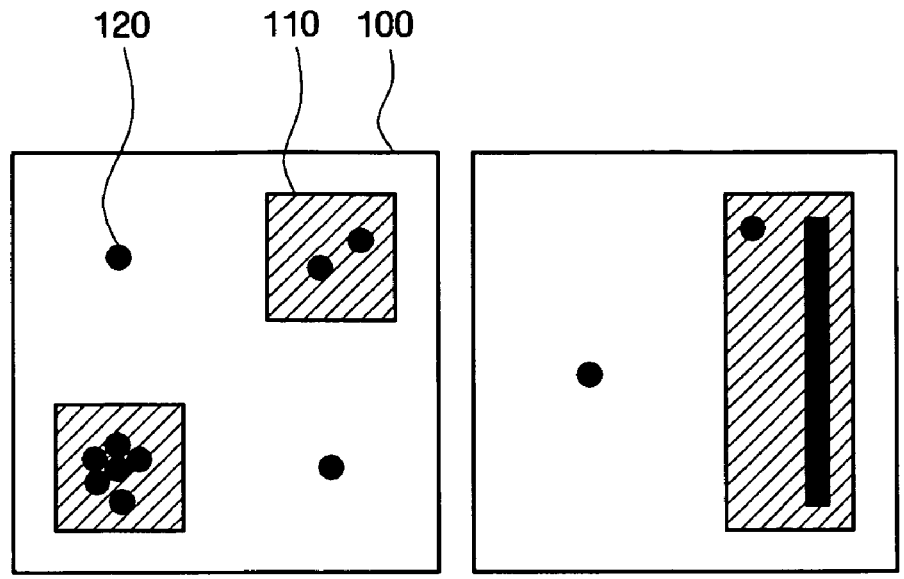
FIG. 5 illustrate a method for matching a position of a defect to a position of a defective bit according to an example embodiment.

Referring to FIG. 5, the larger square 100 indicates a chip, smaller squares 110 indicate defective bits, and the black marks 120 indicate defects. For example, when the smaller squares 110 correspond to the black mark 120, it is determined that both positions match with each other. For example, if black marks 120 fall within the smaller squares 110, the position of the defects is determined to match the position of the defective bit.

Figure 6:
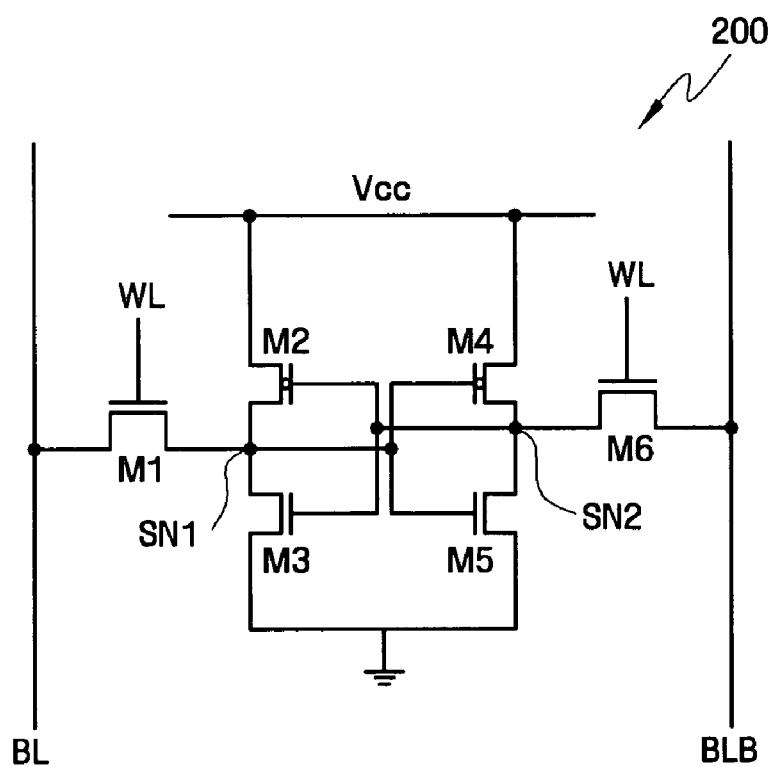
FIG. 6 is a circuit diagram of SRAM cells according to an example embodiment.

The analog characteristic test 40 may be performed to find a cause of a defect corresponding to a defective bit. An example in which the defective bit is an SRAM cell will be described; however, example embodiments are not limited thereto. Referring to FIG. 6, the SRAM cell 200 may include a plurality of transistors. For example purposes, FIG. 6 shows six transistors arranged in a region in which word lines WL intersect bit line pairs BL and BLB. Pull-up transistors M2 and M4 and pull-down transistors M3 and M5 may constitute a cross-coupled inverter. Access transistors M1 may be coupled between storage node SN1 and bitline BL, and access transistor M6 may be coupled between storage node SN2 and bitline BLB. If the SRAM cell 200 is symmetrical, skew may not be generated between the output of the SRAM cell 200 and an output bar. Although not discussed herein for the sake of brevity, example embodiments may also be applicable to a DRAM cell, a flash cell, a PRAM cell, an RRAM cell, an MRAM cell, or the like.

Still referring to FIG. 1, in the analog characteristic test 40, a given voltage may be applied to the bit line BL, the bit line bar BLB and/or the word line WL, and a current flowing into at least one of six transistors M1 to M6 may be measured at the bit line BL and/or the bit line bar BLB. Example biasing conditions of the SRAM cell 200 are shown in Table 1. However, the biasing conditions shown in Table 1 are only illustrative, and example embodiments are not limited thereto.

TABLE 1

| Biasing condition | Bit line BL | Bit line bar BLB | Word line WL |
|---|---|---|---|
| a | Sweep and measurement | Vcc | Vcc |
| b | Sweep | Vcc and measurement | Vcc |
| c | Vcc | Sweep and measurement | Vcc |
| d | Vcc and measurement | Sweep | Vcc |

Under biasing condition a, the change in the current of the bit line BL may be measured while sweeping the bit line BL from about 0 V to a given or desired voltage (e.g., about 1 V), and under the biasing condition b, the change in the current of the bit line bar BLB may be measured while sweeping the bit line BL from about 0 V to a given or desired voltage (e.g., about 1 V). Under biasing condition c, the change in the current of the bit line bar BLB may be measured while sweeping the bit line BLB from about 0 V to a given or desired voltage (e.g., about 1 V) and under the biasing condition d, the change in the current of the bit line BL may be measured while sweeping the bit line bar BLB from about 0 V to a given or desired voltage (e.g., about 1 V). Under the above-discussed biasing conditions, a current flowing into at least one of the access transistors M1 or M6, the pull-up transistors M2 or M4 and/or the pull-down transistors M3 or M5 may be measured.

Still referring to FIG. 1, whether there is a correlation between the located defect and the generated analog characteristic may be determined or verified at 50. A example method for doing so will be described in detail with reference to FIGS. 7 and 8.

Figure 7:
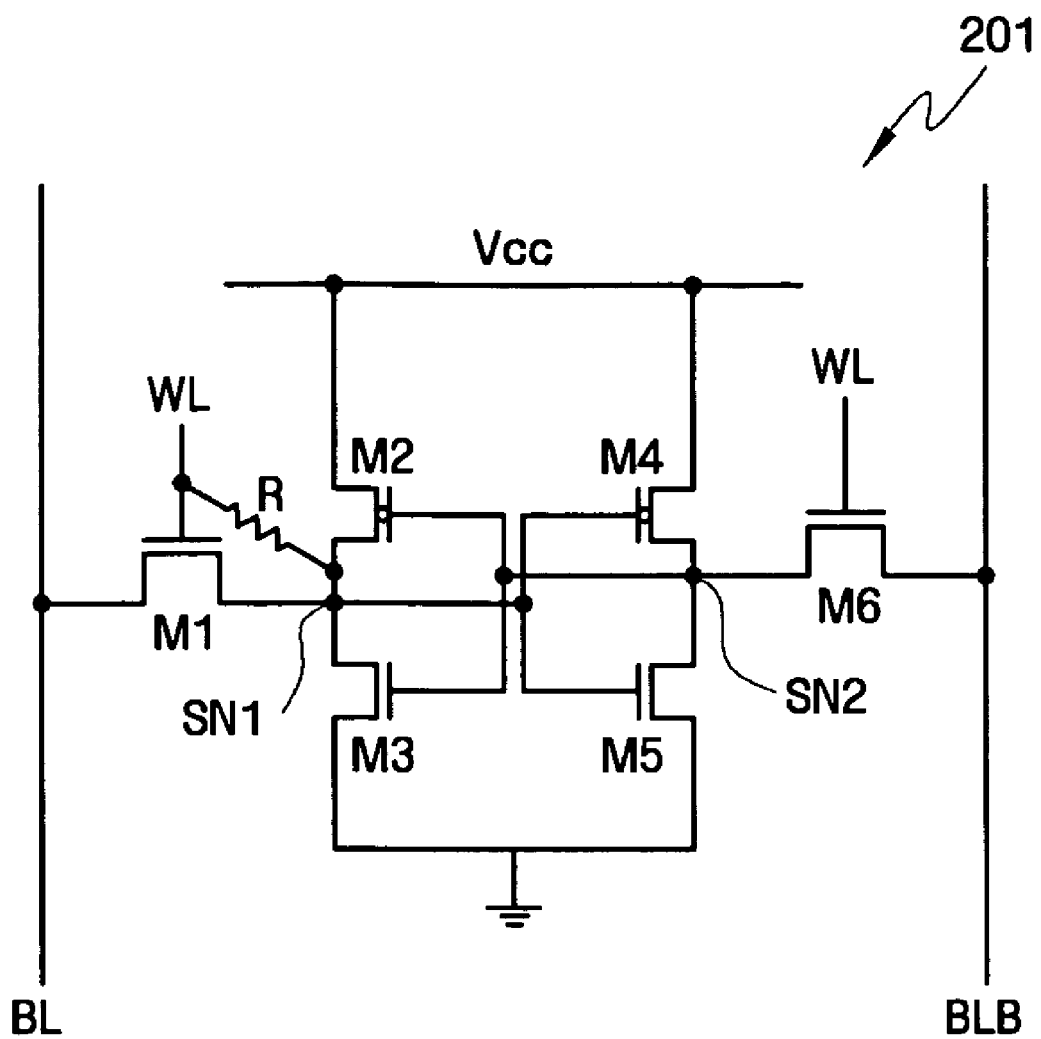
FIG. 7 is a circuit diagram modeling defective SRAM cells according to an example embodiment.
Figure 8:
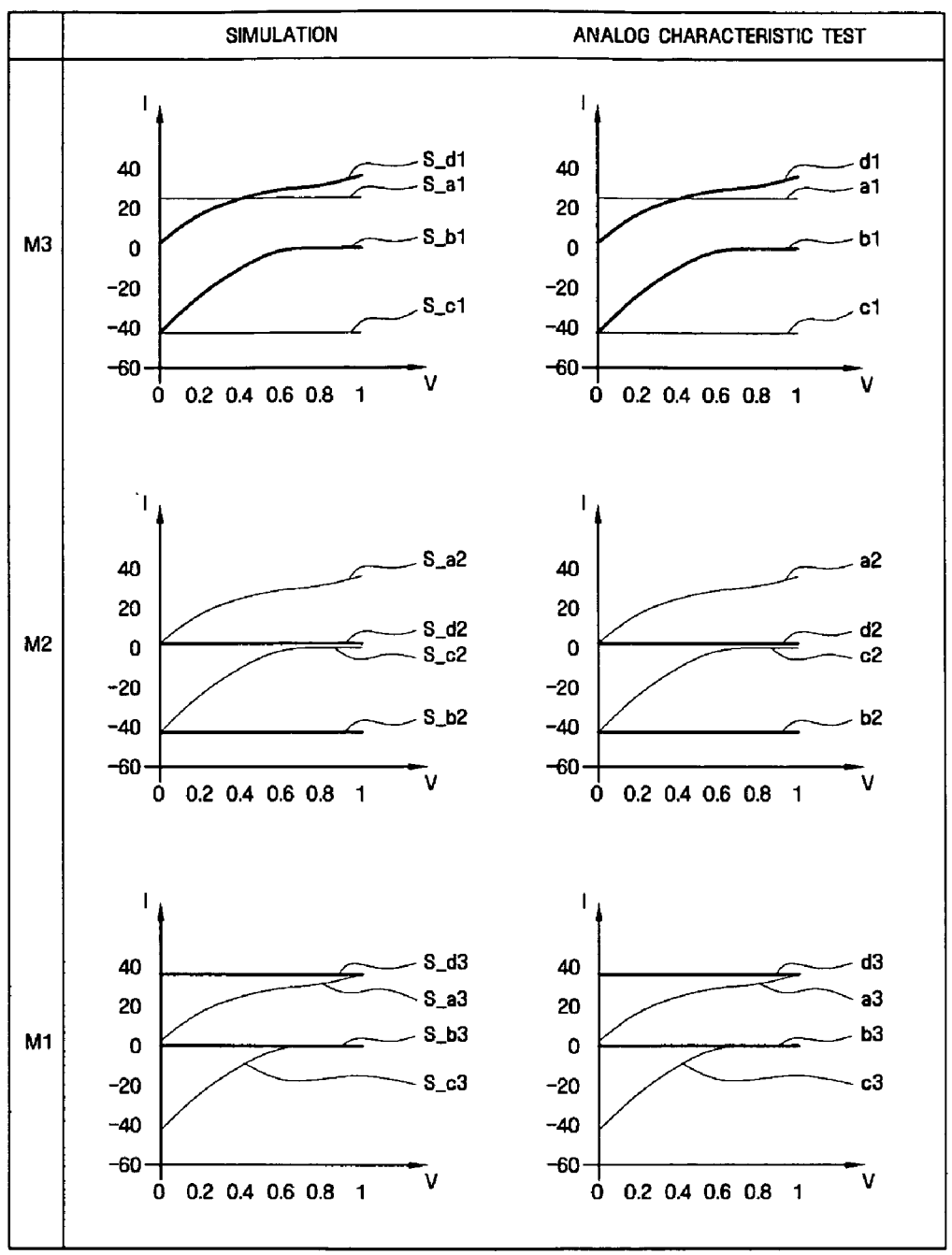
FIG. 8 is a circuit diagram illustrating an analog characteristic obtained by simulating defective SRAM cells and an analog characteristic obtained by an analog characteristic test according to an example embodiment.

FIG. 7 is a circuit diagram modeling an SRAM cell having a defect, and FIG. 8 is a view illustrating analog characteristics obtained by a simulation of the modeled circuit and analog characteristics obtained using the analog characteristic test 40.

Referring to FIG. 7, a photograph of a defect matching the defective bit may be examined, and a circuit 201 reflecting these defects may be modeled. For example, FIG. 7 shows a case in which a bridge R is generated between the storage node SN1 and the word line WL.

An analog characteristic may be generated by simulating the modeled circuit 201. Simulation curves s_a1, s_b1, s_c1, and s_d1 shown in FIG. 8 represent example waveforms of currents flowing into the pull-down transistor M3 of the circuit 201 modeled under the above biasing conditions a, b, c and d; simulation curves s_a2, s_b2, s_c2, and s_d2 represent example waveforms of currents flowing into the pull-up transistor M2 of the circuit 201 modeled under the above biasing conditions a, b, c and d; and simulation curves s_a3, s_b3, s_c3, and s_d3 represent example waveforms of currents flowing into the access transistor M1 of the circuit 201 modeled under the above biasing conditions a, b, c and d.

The analog characteristics obtained in the above-described simulation may be compared with the analog characteristics obtained using the analog characteristic test 40. For example, analog characteristic curves a1, b1, c1 and d1 shown in FIG. 8 represent example waveforms of currents flowing into the pull-down transistor M3 of the defective SRAM cell of the wafer W1 under the above biasing conditions a, b, c and d; analog characteristic curves a2, b2, c2 and d2 represent example waveforms of currents flowing into the pull-up transistor M2 of the defective SRAM cell of the wafer W1 under the above biasing conditions a, b, c and d; and analog characteristic curves a3, b3, c3 and d3 represent example waveforms of currents flowing into the access transistor M1 of the defective SRAM cell of the wafer W1 under the above biasing conditions a, b, c and d.

If a simulation curve and a corresponding analog characteristic curve (e.g., s_a1 and a1, or s_b1 and b1) are similar or substantially similar to one another under the same biasing condition, the defect of the wafer W1 and the measured analog characteristic may be determined to be correlated or matched. In this example, various methods for determining similarities between simulated and analog characteristic curves may be used. For example, a coefficient of correlation between a simulation curve and a corresponding analog characteristic curve may be calculated. If the coefficient of correlation exceeds a given reference value (e.g., about 0.9), the simulation curve and the corresponding analog characteristic curve may be similar. If the simulation curve and the corresponding analog characteristic curve shown in FIG. 6 are similar or substantially similar, they may be correlated.

An analog characteristic determined to be correlated to a simulation curve may be stored in database 60. To generate or create a database 60, the electric test 20, the physical analysis 30, the analog characteristic test 40 and/or the verification 50 may be performed (e.g., repeatedly performed) on a plurality of wafers. The reliability of the stored data may be proportional to the amount of stored data. For example, the more data stored, the more reliable the stored data in the database 60.

When the above-described processes are repeatedly performed on the plurality of wafers, one or more types of defects may be associated with corresponding analog characteristics. This may be because the analog characteristics caused by the defects are equal or substantially equal to each other even though the types of defects are different from each other (e.g., the defect photographs obtained by the physical analysis 30 may be different from each other). For example, when a bridge is generated between nodes, the bridge may be generated on the substrate or on the wiring line. Regardless of whether the bridge is generated on the substrate or the wiring line, however, the analog characteristic curve due to the bridge may be the same or substantially the same.

A database according to an example embodiment is shown in Table 2. When a plurality of types of defects are associated with an analog characteristic of a defect or a defective bit, all or substantially all types of defects associated with the analog characteristic may be stored, and the frequency of the stored defects may also be stored. For example, in Case A (e.g., when a leakage is generated between a storage node and the word line), the number of defects associated with the analog characteristic is three (e.g., A1, A2 and A3) and the frequencies of the defects are 100, 25 and 10.

In Table 2, although only Case A, Case B (e.g., when a leakage is generated between the power terminal Vcc and the storage node) and Case C (e.g., when a leakage is generated between the storage node and a ground terminal Vss) are described as defect types, example embodiments are not limited thereto. In Table 2, the symbol "–" indicates an image, which has been omitted for the sake of clarity.

TABLE 2

| Case | Defect Mode | Analog Characteristic | Kind of Defect | Photograph of Defect | Frequency of Defect |
|------|-------------|----------------------|----------------|---------------------|---------------------|
| A | leakage between storage node and word line | — | A1 A2 A3 | — — — | 100 25 10 |
| B | leakage between power terminal Vcc and storage node | — | B1 B2 | — — | 200 150 |
| C | leakage between ground terminal Vss and storage node | — | C1 C2 | — — | 20 15 |

The defective bit found in the defective area may be associated with or correlated to one or more types of defects. In database 60, the matching defective area and type of defect(s) may be stored as shown in Table 3.

TABLE 3

| Defective area | Case |
|----------------|------|
| Center concentrated type | A G K |
| Hamburger type | A D |
| Cap type | E |

FIG. 2 illustrates a method for establishing a database storing a correlated defect and analog characteristic of the defective bit according to another example embodiment. In FIG. 2, components that are the same as those in FIG. 1 are denoted by like reference numerals, and the description thereof has been omitted for the sake of brevity.

Referring to FIG. 2, defect inspections 11, 12 and 13 may be performed for each of processes P1, P2 and P3. For example, defect inspections 11, 12 and 13 may be performed each time a layer is formed on the wafer W1. The defect inspections 11, 12 and 13 may find defects formed in the external appearance of the wafer W1 using an optical method, scanning or the like. For example, a defect may include a foreign material, defect pattern, etc. The foreign material may be a material formed from the manufacturing equipment during a manufacturing process, a material remaining after the manufacturing process, an etching residue, dust, etc. In some cases, the size of the foreign material may be approximately 0.1 μm to several hundreds of μm. The defect pattern may indicate an undesirable pattern formed during a process such as photography, etching, a hillock, a change in color, etc.

Defect data obtained by the defect inspections 11, 12 and 13 may include a defect position (e.g., an x, y address), a defect photography, a size, a shape, a number, etc., and the defect data may vary depending on a defect inspection device. In the defect data illustrated in FIG. 2, the large circle refers to a wafer, the square in the wafer indicates a chip (or a die), and the black mark indicates a found defect. The defect data illustrated in FIG. 2 indicates the position of the defect in the wafer for the convenience of understanding, but may be different from the defect data obtained by an actual defect inspection device.

An electric test 20 may be performed to find the defective area in the wafer W1. An analog characteristic test 40 in which analog characteristics of the defective bit in the defective area may be measured may then be performed. According to at least this example embodiment, during the analog characteristic test 40 analog characteristics of defective bits in which the position obtained during the electric test 20 matches the defect position obtained during the defect inspections 11, 12 and 13 may be generated. For example, if the address of the defect and the address of the defective bit are relatively close, equal or substantially equal to one another, the position of the defective bit may match the position of the defect.

Whether there is a correlation between the defect and the measured analog characteristic may be determined or verified at 50. The correlated defect and analog characteristic of the associated defective bit may be stored in the database 60.

FIG. 3 illustrates a method of finding a cause of a defect in a wafer according to an example embodiment. In at least this example embodiment, the database 60 may be established using the methods described with regard to FIG. 1 and/or FIG. 2.

When a wafer W2 is inserted into a manufacturing line 1, the first to third processes P1 to P3 may be performed (e.g., sequentially), and a plurality of chips for a semiconductor integrated circuit device may be formed (e.g., simultaneously) in the wafer W2 during the first to third processes P1 to P3. After completing the manufacturing process, an electric test 70 may be performed to generate defective bit data indicative of a defective area in the wafer W2.

An analog characteristic of the defective bit in the defective area of the wafer W2 may be measured using an analog characteristic test 80. In this example, the analog characteristic is a current curve measured under biasing conditions shown in Table 1. In this example, the defective bit for measurement of the analog characteristic may be at least one of a plurality of defective bits in the defective area identified during the electric test 70. The at least one defective bit may be arbitrarily selected.

By comparing the measured analog characteristic associated with the selected defective bit and analog characteristics stored in the database 60, a defect causing the defective area may be determined and/or found at 90. For example, by comparing the measured analog characteristics and the analog characteristic stored in the database 60, defects causing the plurality of defective bits may be found.

For example purposes, a method of determining the defect causing the defective bit by comparing one measured analog characteristic and the analog characteristic stored in the database 60 will be described. Among a plurality of analog characteristics stored in the database 60, one or more analog characteristics that are similar or substantially similar to the measured analog characteristic may be selected. For example, a coefficient of correlation between a curve of the measured analog characteristic and a curve of the analog characteristic stored in the data base 60 may be calculated, and if the coefficient of correlation is larger than a reference value (e.g., about 0.9), the measured analog characteristic and the stored analog characteristic may correspond to one another (e.g., they may match). If the measured analog characteristic and the stored analog characteristic are determined to correspond, one or more types of defects associated with the stored analog characteristic curve may be output while the curves of one or more similar analog characteristics are stored in the database 60 in association with the types of defects output. In this example, the frequency stored together with the one or more types of defects may also be output.

An example of one or more analog characteristics similar to the measured analog characteristics and defects is shown in Table 4. In Table 4, the symbol "–" indicates an image, and has bee omitted for the sake of clarity. In Table 4, the measured analog characteristics and the correlated or similar analog characteristics are shown in order according to degree of similarity. For example, Case A has the most similar analog characteristics to the measured analog characteristic, whereas cases G and K have less similar analog characteristics. In each case, because the types of defects and the frequency are output, the more common defect of the measured analog characteristics may be determined to be the cause.

TABLE 4

| Measured Analog Characteristic | Order | Similar Analog Characteristic | Case | Kind of Defect | Photograph of Defect | Frequency of Defect |
|---|---|---|---|---|---|---|
| — | 1 | — | A | A1 | — | 100 |
|  |  |  |  | A2 | — | 25 |
|  |  |  |  | A3 | — | 10 |
|  | 2 | — | G | G1 | — | 10 |
|  |  |  |  | G2 | — | 8 |
|  | 3 | — | K | K1 | — | 70 |
|  |  |  |  | K2 | — | 15 |
|  |  |  |  | K3 | — | 14 |

Among defects that cause a plurality of defective bits, a defect whose frequency exceeds a given ratio (e.g., about 50%) may be identified as the cause of the defect of the defective area. For example, Table 5 shows the result analogized as a defect causing the defective bit by comparing the measured analog characteristic and the analog characteristic stored in the database 60. Referring to Table 5, when 20 analog characteristics of defective bits in the defective area are measured, the number of defective bits classified in Case A (where the type of defect is A1) is 14, the number of defective bits classified in Case G (where the type of defect is G1) is 5, and the number of defective bits classified in Case K (where the type of defect is K1) is 1. In this example, in a "center-concentrated type" of defective area, the defect caused by Case A occupies more than about 50%. Therefore, the "center-concentrated type" defective area is determined to be caused by Case A. In this example, the ratio of about 50% or more is illustrative and not limiting, and the ratio may be easily modified.

TABLE 5

"Center-Concentrated Type" Defective Area
defect cause: Case A

| Classification | Measured Analog Characteristic | Case A (A1) | Case G (G1) | Case K (K1) |
|---|---|---|---|---|
| Number | 20 | 14 | 5 | 1 |

In at least this example embodiment, because the defect analysis is performed by creating a database of the types of defects and associated analog characteristics, a defect inspection need not be performed during the manufacturing process, and a physical analysis need not be performed after the manufacturing process. In addition, more common defects associated to the analog characteristics measured in the defective area may be found more easily. As a result, according to at least this example embodiment, the defect may be analyzed more precisely and/or quickly as compared with the related art.

Figure 9:
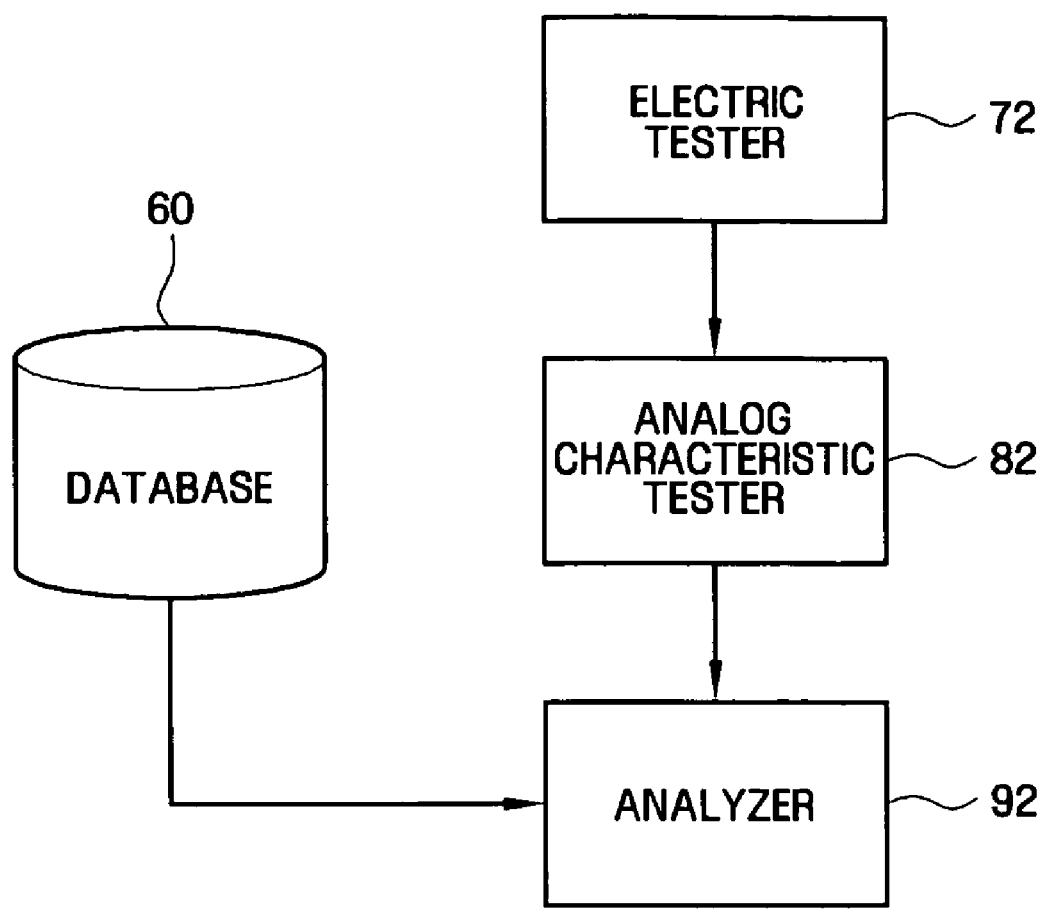
FIG. 9 is a block diagram illustrating a defect analysis system of a semiconductor integrated circuit device according to an example embodiment.

FIG. 9 is a block diagram illustrating a defect analysis system of a semiconductor integrated circuit device according to an example embodiment. For example purposes, FIG. 9 shows an a system implementing the defect analysis method of FIG. 3, but example embodiments are not limited thereto.

Referring to FIG. 9, the defect analysis system may include a database 60, an electric tester 72, an analog characteristic tester 82 and/or an analyzer 92.

The database 60 may store a correlated type of defect and one or more associated analog characteristics of a defective bit. When various types of defects are correlated with the analog characteristic of the defective bit are present, all or substantially all types of defects associated with the analog characteristic may also be stored together with the types of defects in the database 60. Data stored in the database 60 may be the same or substantially the same as Tables 2 and/or 3.

The electric tester 72 may measure electrical characteristics of a memory cell in the chip manufactured through the manufacturing lines to locate a defective area. For example, the electric tester 72 may write data in the memory cell, and read out data from the memory cell. If the read data does not match the written data, the electric tester 72 may define the memory cell as a defective bit, and identify a defective area formed by the defective bits. In this example, the electric tester 72 may find the defective bit, and the operator may determine whether the defective area is formed or not.

The analog characteristic tester 82 may measure an analog characteristic of the defective bit in the defective area. The defective bit for measuring the analog characteristic may be at least one of a plurality of defective bits in the defective area. The at least one defective bit may be selected arbitrarily. The analog characteristic tester 82 may measure the intensity of a current flowing under the biasing conditions of Table 1 if the bit is an SRAM cell.

The analyzer 92 may compare the measured analog characteristic and the analog characteristics stored in the database 60 to identify the type of defect causing the defective area. According to at least some example embodiments, the analyzer 92 may compare a plurality of measured analog characteristics and the analog characteristic stored in the database 60 to find defects causing a plurality of defective bits. For example, the analyzer may calculate a coefficient of correlation between the measured analog characteristic and a stored analog characteristic, and if the coefficient of correlation is greater than a given ratio (e.g., about 0.9), the type of defect associated with the stored analog characteristic is identified as a cause of the defective area.

The analyzer 92 may provide or output types of defects causing the plurality of defective bits, one or more analog characteristics similar to the analog characteristic measured by the electric tester 72 and/or frequencies associated with the one or more types of defects. Examples of at least one of analog characteristics similar to the measured analog characteristics and the defects are shown in Table 4. The cause of the defect of the defective area may be determined as discussed above with regard to Table 5.

Although not shown in figures, when establishing the database 60 using the method of FIG. 2, a defect inspector for finding a defect in the wafer (W1 in FIG. 2) may also be included. During the process of establishing the database 60, the electric tester 72 may find a defective bit in the wafer W1, the analog characteristic tester 82 may measure the analog characteristic of the found defective bit, and the analyzer 92 may verify whether there is a correlation between the defect of the wafer W1 and the analog characteristic. The correlated defect and the analog characteristic of the defective bit may be stored in the database 60.

According to defect analysis methods and systems according to example embodiments, defect inspections and/or physical analysis need not be performed during or after the manufacturing process because of the database. Furthermore, a defect that is relatively highly correlated with a measured analog characteristic may be identified more easily. As a result, according to at least some example embodiments, defects may be analyzed more precisely and/or quickly.

Although the present invention has been described in connection with the example embodiments, it will be apparent to those skilled in the art that various modifications and changes may be made thereto without departing from the scope and spirit of the present invention. Therefore, it should be understood that the above example embodiments are not limitative, but illustrative in all aspects.

What is claimed is:

1. A defect analysis method comprising:
    storing at least one first defect and at least one associated analog characteristic in a database;
    locating a first defective area in a first wafer;
    measuring at least one analog characteristic of at least one first defective bit within the first defective area;
    using an analyzer for comparing the at least one measured analog characteristic with the at least one stored analog characteristic to determine whether the at least one first defect is a cause of the at least one first defective area; and
    identifying a cause of the first defective area based on a size of the at least one first defect and a first ratio.

2. The method of claim 1, further including,
    locating a second defective area in a second wafer,
    identifying at least one second defective bit within the second defective area,
    measuring at least one analog characteristic of the at least one second defective bit,
    associating the at least one second defective bit and the at least one measured analog characteristic with the at least one first defect; wherein
    the storing stores the at least one first defect and the associated at least one measured analog characteristic in the database.

3. The method of claim 2, wherein the associating further includes,
    modeling a circuit indicative of the at least one first defect, and
    associating the at least one first defect with the at least one second defective bit based on a comparison of an analog characteristic obtained by simulating the modeled circuit and the at least one measured analog characteristic for the at least one second defective bit.

4. The method of claim 2, wherein the locating of the second defective area in the second wafer includes,
    performing an electric test on the second wafer to determine a position of the at least one second defective bit, the electric test being performed after manufacturing the second wafer.

5. The method of claim 4, further including,
    performing a physical analysis to determine a position of the at least one first defect, the physical analysis being performed after manufacturing the second wafer.

6. The method of claim 5, wherein the measuring measures at least one analog characteristic of the at least one second defective bit having a position matching a position of the at least one first defect.

7. The method of claim 4, further including,
    performing a defect inspection on the second wafer during the manufacturing process of the second wafer to determine a position of at least one first defect formed on the second wafer.

8. The method of claim 7, wherein the measuring measures at least one analog characteristic of the at least one second defective bit having a position matching a position of the at least one first defect.

9. The method of claim 1, wherein the locating the first defective area in the first wafer includes,
    performing an electric test to determine a position of at least one first defective bit, the electric test being performed after manufacturing the first wafer.

10. The method of claim 1, wherein the at least one first defective bit is a static random access memory cell, and the measuring of the at least one analog characteristic of the at least one first defective bit includes,
    measuring at least one analog characteristic of at least one transistor included in the static random access memory cell.

11. The method of claim 10, wherein the measuring of the at least one analog characteristic of the at least one transistor includes,
    applying a first voltage to a first bit line, a second bit line and a word line, and
    measuring a current flowing into the at least one transistor.

12. The method of claim 1, wherein the measuring of the at least one analog characteristic of the at least one first defective bit includes,
    selecting the at least one first defective bit from a plurality of first defective bits in the first defective area, and
    measuring at least one analog characteristic for the selected at least one first defective bit.

13. The method of claim 1, wherein the first defect is a cause of the first defective area if the size of the first defect is larger than a first ratio.

14. The method of claim 1, further including,
    performing an electric test on the second wafer to locate a second defective area in a second wafer, the second defective area being formed by a plurality of defective static random access memory cells, performing a physical analysis on the second defective area to identify a plurality of second defects in the second wafer, measuring analog characteristics of defective static random access memory cells having associated positions matching positions of second defects in the second defective area, determining whether there is a correlation between each second defect and each defective static random access memory cell, storing, in the database, each correlated second defect and associated analog characteristic, wherein the first defective area is formed by defective static random access memory cells and located by performing an electric test on the first wafer.

15. The method of claim 14, wherein the measuring of the analog characteristics of the defective static random access memory cells includes, selecting at least one defective static random access memory cell among a plurality of defective static random access memory cells, and measuring analog characteristics associated with the at least one selected defective static random access memory cell.

16. A defect analysis system comprising:

a database configured to store at least one first defect and at least one associated analog characteristic;

an electric tester configured to locate a first defective area in a first wafer;

an analog characteristic tester configured to measure at least one analog characteristic of at least one first defective bit within the first defective area; and an analyzer configured to analyze a defect by comparing the at least one measured analog characteristic with the at least one stored analog characteristic to determine whether the at least one first defect is a cause of the at least one first defective area, wherein the analyzer is further configured to locate a first defect associated with each of the plurality of the first defective bits by comparing the at least one measured analog characteristic and the at least one analog characteristic stored in the database, and determine a cause of the first defective area based on a size of the located first defect and a first ratio.

17. The system of claim 16, further including, a defect inspector configured to locate at least one second defect in a second wafer by performing defect inspection on a second wafer.

18. The system of claim 17, wherein the electric tester is further configured to locate a second defective area in the second wafer, the analog characteristic tester is further configured to measure at least one analog characteristic of at least one second defective bit in the second defective area, and the analyzer is further configured to determine whether the at least one second defect and the at least one analog characteristic are correlated, and store the at least one second defect and correlated at least one analog characteristic in the database if the at least one second defect and at least one analog characteristic are determined to be correlated.

19. The system of claim 16, wherein the at least one first defective bit is selected from a plurality of first defective bits in the first defective area.

20. The method of claim 16, wherein the analyzer determines that the first defect is a cause of the first defective area if the size of the located first defect is larger than the first ratio.

* * * * *